United States Patent [19]
Kim

[11] Patent Number: 6,028,931
[45] Date of Patent: Feb. 22, 2000

[54] EPROM ENCRYPTION CODE DECODING PREVENTION CIRCUIT FOR SEMICONDUCTOR MEMORY DEVICE

[75] Inventor: Sung Sik Kim, Choongcheongbuk-Do, Rep. of Korea

[73] Assignee: LG Semicon Co., Ltd., Cheongju, Rep. of Korea

[21] Appl. No.: 08/896,679

[22] Filed: Jul. 18, 1997

[30] Foreign Application Priority Data

Jul. 20, 1996 [KR] Rep. of Korea .................. 96/29468

[51] Int. Cl.[7] .............. G11B 23/28; H04L 9/00; G11C 16/04
[52] U.S. Cl. ................... 380/3; 380/4; 380/43; 711/104; 711/105; 365/189.01
[58] Field of Search ............... 380/3, 4, 43; 711/104, 711/105; 365/189.01

[56] References Cited

U.S. PATENT DOCUMENTS

| | | |
|---|---|---|
| 4,757,468 | 7/1988 | Domenik et al. . |
| 5,046,095 | 9/1991 | Akiyama .......................... 380/50 |
| 5,058,164 | 10/1991 | Elmer et al. . |
| 5,247,577 | 9/1993 | Bailey et al. . |
| 5,313,520 | 5/1994 | Han ................................. 380/4 |
| 5,377,264 | 12/1994 | Lee et al. ......................... 380/4 |
| 5,892,826 | 4/1999 | Brown et al. .................... 380/4 |

*Primary Examiner*—Gail O. Hayes
*Assistant Examiner*—Hrayr A. Sayadian
*Attorney, Agent, or Firm*—Fleshner & Kim

[57] ABSTRACT

An encryption code decoding prevention circuit for a semiconductor memory device, such as an EPROM, includes a plurality of encryption code cells, an encryption word line operator, a word line operator, a plurality of read data encrypting processors for encrypting data output from memory cells, and an output data detector for enabling an output detecting signal when all bit lines are judged not to have data thereon, by checking an n-bit output applied from the read data encrypting processors to an output buffer. The output buffer amplifies the n-bit data output from the read data encrypting processors and outputs an output data of "1" each time a carry value is applied thereto from the encryption word line operator. The circuit prevents encrypted data from being exposed by making it appear as if unused memory cells are in use by simulating data values of "1" for each of the unused cells.

12 Claims, 4 Drawing Sheets

FIG.2
CONVENTIONAL ART

| ENCRYPTION CODE DATA | EPROM CELL DATA | OUTPUT DATA |
|---|---|---|
| 0 | 0 | 1 |
| 0 | 1 | 0 |
| 1 | 0 | 0 |
| 1 | 1 | 1 |

EPROM ENCRYPTION CODE DECODING PREVENTION CIRCUIT FOR SEMICONDUCTOR MEMORY DEVICE

BACKGROUND OF THE INVENTION

1. Field of the Invention

The present invention relates to a memory device, and more particularly, to an EPROM encryption code decoding prevention circuit for a semiconductor memory device.

2. Background of the Related Art

As shown in FIG. 1, a data encrypting circuit of a semiconductor memory device, such as a conventional EPROM cell, includes an encryption code data cell 11A outputting encryption code data per bit line when an encryption word line signal EW/L is applied thereto by an external controller. A word line operator 12 generates a word line signal W/L according to an externally applied address signal ADD to select one of the column memory cells $MC_1$–$MC_m$ for reading data stored therein of a memory array 11B. An encryption processor 13 logically combines the output from the cell of the memory array 11B with the encryption data of encryption code data cell 11A and provides the encrypted data on the output terminal $D_{out}$.

In FIG. 1, the data output circuit is drawn on the basis of a 1-bit line signal B/L, wherein a cell is selected from a plurality m of cells $MC_1$–$MC_n$ connected to one bit line. The data stored in the selected cell $MC_1$–$MC_n$ is logically combined with the encryption data stored in an encryption code data cell 11A, the transistor EC being connected to the corresponding bit line B/L. The resulting value is outputted in an encrypted type. The output timing steps will now be described.

At a first step, the word line operator 12 drives a designated word line $W/L_x$ selected from a plurality of word lines $W/L_1$–$W/L_n$. Accordingly, a corresponding memory cell $MC_x$ selected from the multiple memory cells $MC_1$–$MC_n$ is enabled, whereby a 1-bit data read from the corresponding cell is outputted through the bit line $B/L_x$.

At this time, a write signal W remains at a low level to maintain an off-state of NMOS transistor NM1. A data read signal R turns to a high level for enabling a second NMOS transistor NM2. An encryption data read signal ER turns to a high level to thereby enable a third NMOS transistor NM3. A read control signal RC turns to a low level to maintain a fourth NMOS transistor NM4 disabled. Accordingly, the output data from the bit line $B/L_x$ sequentially passes through the second NMOS transistor NM2, a first latch LAT1, and the third NMOS transistor NM3 and is latched in a second latch LAT 2.

At a second step, the encryption word line signal EW/L turns to a high level to enable an NMOS transistor EC of the encryption data cell 11A. Accordingly, an encrypted data is outputted through the bit line $B/L_x$. At this time, the write signal W remains at a low level to disable the first NMOS transistor NM1, and the data read signal R turns to a high level to enable the second NMOS transistor NM2. Then, the encrypted data read signal ER remains at a low level to disable the third NMOS transistor NM3. As a result, the 1-bit encryption data via the bit line B/L is latched through the second NMOS transistor NM2 into the first latch LAT1.

At a third step, the encryption data read signal ER turns to a low level to disable the third NMOS transistor NM3. The read control signal RC turns to a high level to enable the on-state of fourth NMOS transistor NM4. Accordingly, the encrypted data latched in the first latch LAT1 and the cell data latched in the second latch LAT2 are NORed at a NOR gate NOR1 and XNORed at an exclusive NOR gate XOR1 sequentially. The resultant value is applied through the fourth transistor NM4 as an output signal Dout.

The above first to third steps are repeatedly performed to encrypt the output data Dout while the data stored in the memory array 11B is read and externally outputted. A truth table of FIG. 2 illustrates the encryption of the cell data. For instance, in the case in which an encryption code data is "0" and a data cell data is "0", the cell data is latched in the second latch LAT2 through the previously described steps. The the encryption data is inverted to "1" and stored in the first latch LAT1. At this time, since the encryption data read signal ER is "0", the encryption code data latched in the first latch LAT1 outputs the inverted "0" through the NOR gate NOR1, and a value of "0" is applied to each of the inputs of the exclusive NOR gate XNOR1 which in turn outputs a value "1". An encrypted cell data "0" is output as the data value.

Therefore, because the EPROM cell data is logically combined with the encryption code data and the resultant encrypted data is outputted, the data stored in the memory array 11B cannot be retrieved without knowledge of the encryption data. However, the conventional data encrypting circuit has several disadvantages as follows.

When every memory cell is employed to store data, the encrypted data is not exposed. When only a part of the memory cells are used to store data, the other unused data cells uniformly remain at a value "0". Further, the final output data is outputted as a uniformly inverted encryption code data whereby an unauthorized user may discern the encrypted data based upon the output data. The unauthorized user may be able to read the original cell data by XNORing the final output data stored in a cell and the discerned encryption data, thereby preventing the objectives of the encryption data cell adaptability.

The above references are incorporated by reference herein where appropriate for appropriate teachings of additional or alternative details, features and/or technical background.

SUMMARY OF THE INVENTION

An object of the present invention is to solve the problems of the related art.

Another object of the present invention is to provide an encryption code decoding prevention circuit for a semiconductor memory device to prevent an encrypted data from being exposed to unauthorized users.

Another object is to prevent the unauthorized users from judging whether memory cells are in use.

To achieve the above-described object, the encryption code decoding prevention circuit for a semiconductor memory device according to the present invention includes: a plurality of encryption code cells, each storing a number of encryption data on each bit line and outputting a corresponding encryption code data in accordance with selectively enabled multiple encryption word lines; an encryption word line operator for enabling a corresponding encryption word line by incrementing up an internal count value by one each time an output detecting signal turns to a first prescribed level, stopping further counting when all ready-set values are counted, and continuously outputting a carry value to an output buffer; a word line operator for operating a corresponding word line selected from a plurality of word lines in accordance with an input address signal; a plurality of read data encrypting processors for encrypting data output from the memory cells by using the encryption code data output from the encryption code data cells; an output data detector for enabling the output detecting signal when all bit lines are judged not to have data thereon, by checking an n-bit output applied from the read data encrypting processors to the output buffer; and an output buffer for amplifying the n-bit data output from the read data encrypting processors and outputting an output data "1" each time a carry value is applied thereto from the encryption word line operator.

The objects, features and/or advantages may be achieved in whole or in part by a memory device comprising: a plurality of encryption memory arrays, each having a plurality of encryption cells for storing encryption code data; a plurality of memory arrays, each having a plurality of memory cells for storing information data; a first word line operator that selects one of a plurality of word lines, each word line coupled to a corresponding memory cell of each memory array; an encryption word line operator that selects one of a plurality of encryption word lines, each coupled to a corresponding encryption cell of each encryption memory array; a bit line operator that selects one of a plurality of bit lines, each coupled to correspond one of said plurality of memory arrays and encryption memory arrays; a plurality of encrypting processors, each encrypting the information data with the encryption code data provide on a corresponding bit line; a detector coupled to each encrypting processor to detect a prescribed condition and coupled to the encryption word line operator; and an output buffer coupled to each encrypting processor.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 2 is a truth table of the circuit of FIG. 1;

DETAILED DESCRIPTION OF PREFERRED EMBODIMENTS

Figure 1:
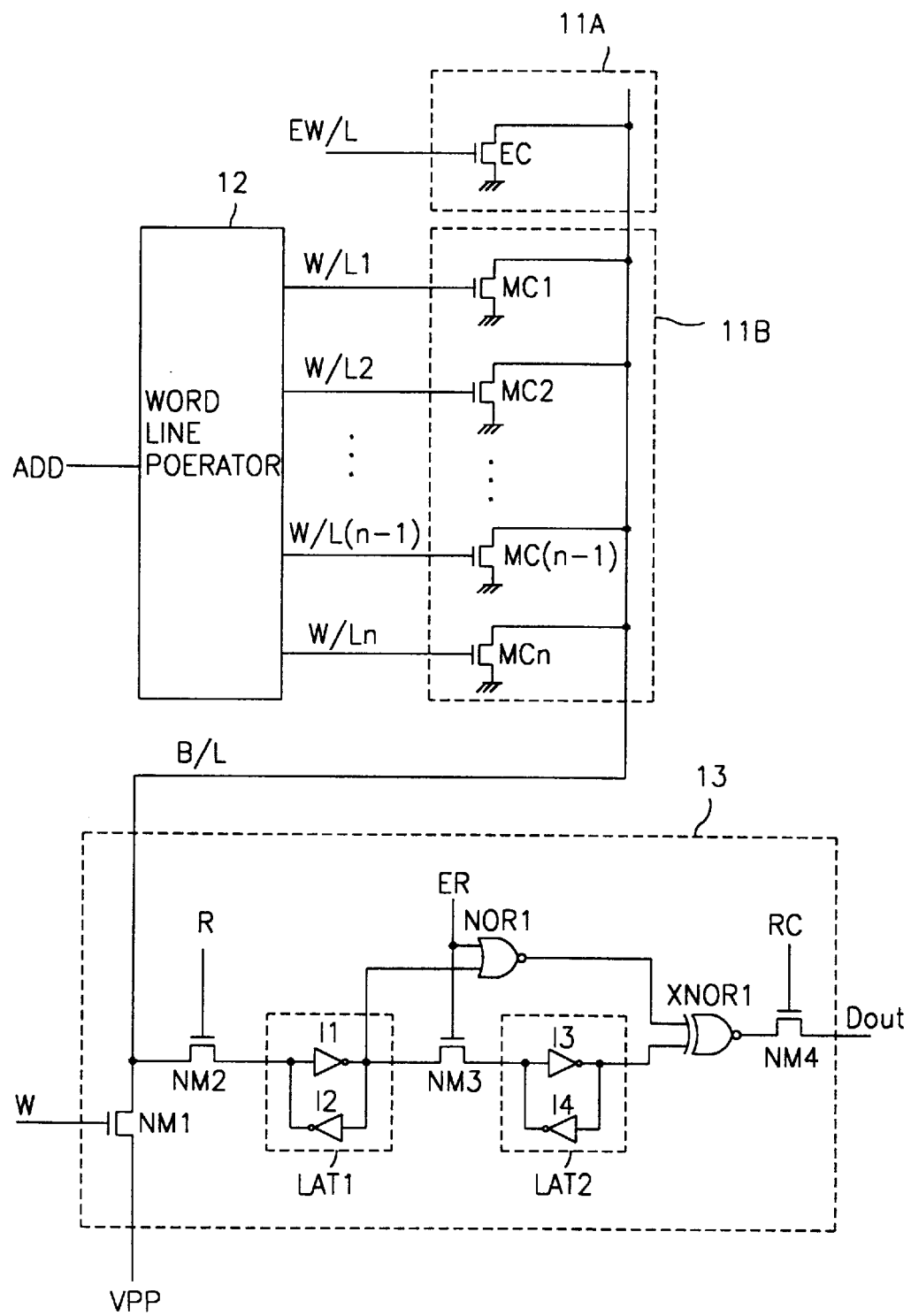
FIG. 1 is a schematic block diagram show in an encrypting circuit of a memory cell of a semiconductor memory device.
Figure 3:
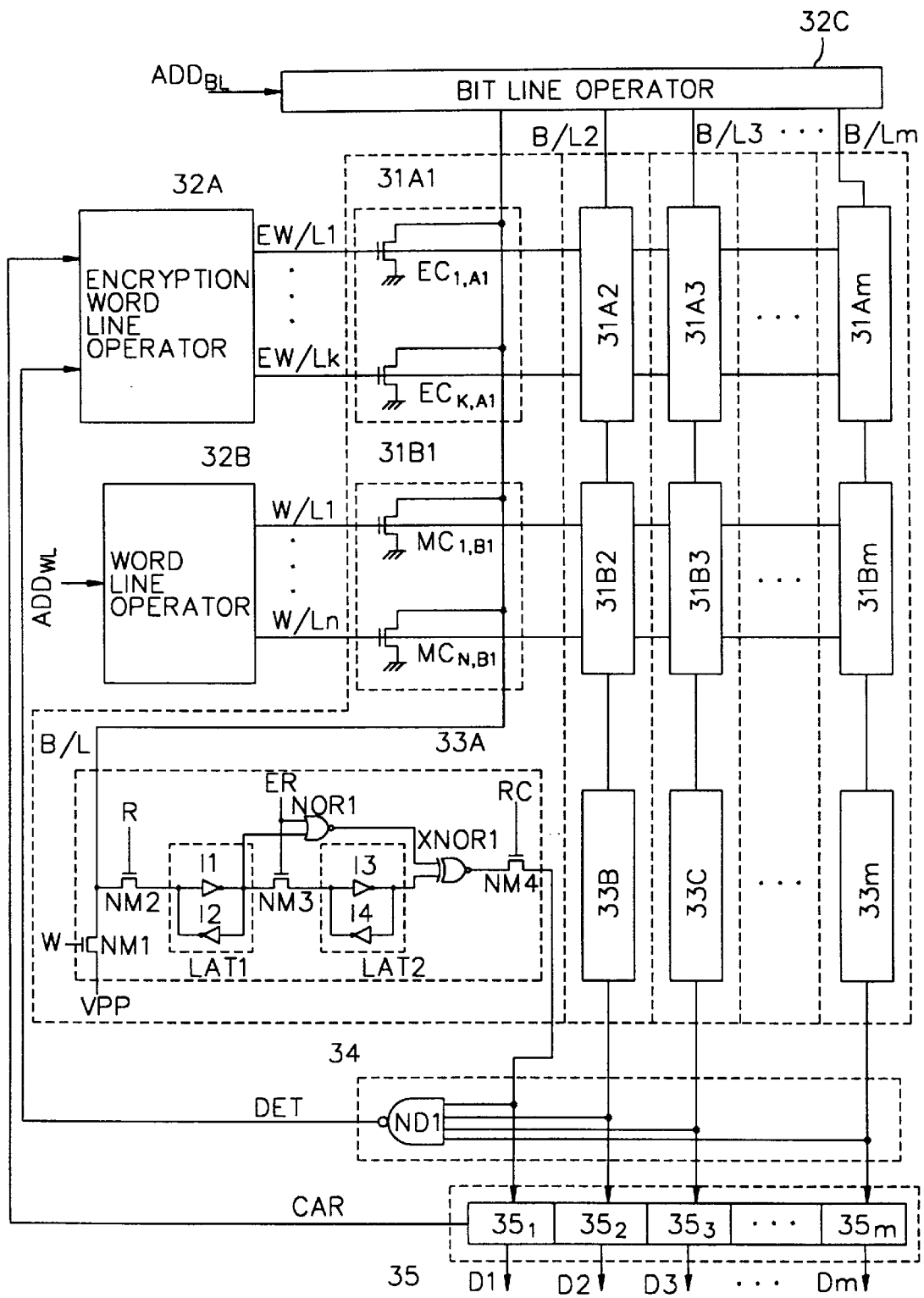
FIG. 3 is a block diagram showing an encryption code decoding prevention circuit for a semiconductor memory device in accordance with the present invention.

FIG. 3 illustrates a semiconductor memory device, such as an EPROM, having an encryption code decoding prevention circuit in accordance with the present invention. The encryption code decoding prevention circuit includes a plurality of encryption code arrays $31A_1$–$31A_m$ for storing a prescribed number of encryption data and outputting a corresponding encryption code data in accordance with multiple encryption word line signals $EW/L_1$–$EW/L_k$. A plurality of memory arrays $31B_1$–$31B_n$, outputs n-bit data stored in a corresponding memory, e.g., memory cells $MC_{1,B1}$–$MC_{11,B1}$, in accordance with a word line signal $W/L_x$ selected from a plurality of word line signals $W/L_1$–$W/L_n$.

An encryption word line operator 32A enables a corresponding word line by incrementing an internal count value by one each time an output detecting signal DET turns active; stopping the further counting when all the ready-set values are counted; and continuously outputting a carry value to an output buffer 35. A word line operator 32B enables a corresponding word line $W/L_x$ selected from the plurality of word lines $W/L_1$–$W/L_n$ in accordance with an input address signal $ADD_{WL}$. A bit line operator 32C enables a corresponding bit line $BL_x$ selected from a plurality of bit lines $B/L_1$–$B/L_m$ in accordance with an input address signal $ADD_{BL}$. A plurality of read data encrypting processors 33A–33M encrypts n-bit data retrieved from the memory arrays $31B_1$–$31B_m$ by using the n-bit encryption code data output from the encryption code data cells $31A_1$–$31A_m$.

An output data detector 34 provides the output detecting signal DET when all the bit lines are judged not to have data thereon by checking the n-bit output applied to the output buffer 35 from the read data encrypting processors 33A–33M. An output buffer 35 amplifies the n-bit data output from the read data encrypting processors 33A–33M and outputs an output data of "1" for each of the n-bit output data when a carry value is applied thereto from the encryption word line operator 32A.

Figure 4:
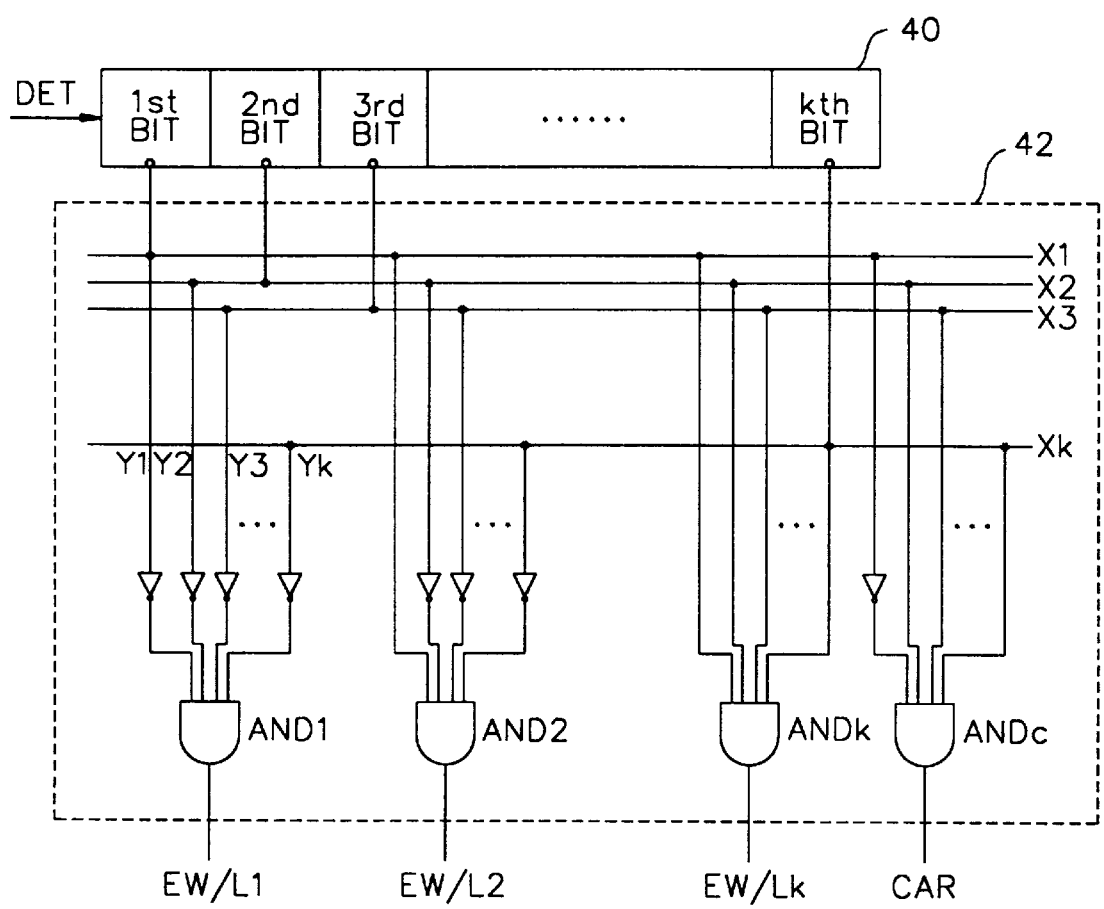
FIG. 4 which illustrates detailed schematic of an encryption word line operator of FIG. 3.

FIG. 4 illustrates in detail the encryption word line operator 32A, which includes a k-bit counter 40 and signal matrix lines X1–Xk and Y1–Yk coupled to corresponding inverters and AND gates AND1–ANDk and ANDc. First to k-th bits are coupled to lines X1–Xk, respectively, and lines X1–Xk are coupled to lines Y1–Yk, respectively. Each line Y1 . . . Yk is coupled to an inverter or AND gate AND1–ANDk or ANDc.

Initially, the count value stored in the counter 40 is 0,0,0, . . . ,0 (1st, 2nd, 3rd, . . . , kth bit). As a result, the AND gates AND1–ANDk output 1,0, . . . , 0 on the encryption word lines $EW/L_1$, $EW/L_2$, . . . ,$EW/L_k$, respectively. When the count value is incremented by one in response to the output detecting signal DET, the count value stored in the counter 40 is 1,0,0, . . . , 0 (1st, 2nd, 3rd, . . . , kth bit). As a result, the AND gates AND1–ANDk output 0, 1, . . . , 0 on the encryption word lines $EW/L_1$, $EW/L_2$, . . . , $EW/L_k$, respectively. The counter is repeatly increment to 1,1,1, . . . ,1 (1st, 2nd, 3rd, . . . , kth bit), and the AND gates AND1–ANDk output 0,0, . . . , 1 on the encryption word lines $EW/L_1$, $EW/L_2$, . . . ,$EW/L_k$, respectively. When the counter is incremented to 0,1,1, . . . ,1 (1st, 2nd, 3rd, . . . , kth bit), the AND gates AND1–ANDk output 0,0, . . . ,0 on the encryption word lines $EW/L_1$, $EW/L_2$, . . . ,$EW/L_k$; however, the AND gate ANDc generates a carry bit of a high level, and the counter is reset to 0,0,0 . . . ,0, and the process is repeated.

In FIG. 3, the memory cell data output circuit is drawn on the basis of a 1-bit line B/L, wherein a cell is selected from a plurality of memory cells, e.g., $MC_{1,B1}$, which are respectively connected to the 1-bit lines, and the data stored in the cell is logically combined with data from the multiple encryption cells, e.g., $EC_{1,A1}$–$EC_{k,A1}$, which are respectively connected to a corresponding bit line, e.g., $B/L_1$. The resulting value is outputted as an encrypted signal.

The output timing steps will now be described with reference to an initial selection of the word line W/L, and the bit line $B/L_1$ as an example. In a first step, the word line operator 32B enables a word line $W/L_1$ selected from the plurality of word lines $W/L_1$–$W/L_n$. A corresponding memory cell $MC_{1,B1}$ selected from the multiple memory cells $MC_{1,B1}$ to $MC_{n,B1}$ is enabled, whereby 1-bit data read from the corresponding cell is outputted through the bit line $B/L_1$.

At this time, a write signal W remains at a low level to serve to maintain an off-state of NMOS transistor NM1. A data read signal R of the EPROM cell $31B_1$ turns to a high level for thereby enabling a second NMOS transistor NM2. Then, an encryption data read signal ER turns to a high level to thereby enable a third NMOS transistor NM3. A read control signal RC turns to a low level to maintain a fourth NMOS transistor NM4 disabled. Accordingly, the output data from the bit line $B/L_1$ sequentially passes through the second NMOS transistor NM2, a first latch LAT1, the third NMOS transistor NM3 and is latched in a second latch LAT2.

In a second step, a first encryption word line signal $EW/L_1$ of the eight encryption word lines $EW/L_1$–$EW/L_k$ turns to a high level to enable a first encryption cell $EC_{1,A1}$ of the encryption data cell $31A_1$. Accordingly, a prescribed encrypted data is outputted through the bit line $B/L_1$. At this time, the write signal W remains at a low level to disable the first NMOS transistor NM1, and the data read signal R of the EPROM cell 31B turns to a high level to enable the second NMOS transistor NM2. Then, the encryption data read signal ER goes to a low level to disable the third NMOS transistor NM3. As a result, the 1-bit encryption data via the bit line $B/L_1$ is latched through the second NMOS transistor NM2 into the first latch LAT1.

In a third step, the encryption data read signal ER remains at a low level to disable the third NMOS transistor NM3. The read control signal RC turns to a high level to enable the on-state of fourth NMOS transistor NM4. Accordingly, the encrypted data latched in the first latch signal LAT1 and the cell data signal latched in the second latch LAT2 are sequentially NORed at a NOR gate NOR1 and XNORed at an exclusive NOR gate XNOR1. The encrypted data in LAT1 is NORed with low level ER signal in NOR1, then output signal of NOR1 and data in LAT2 are logically XNORed in XNOR gate XNOR1. The resultant value is applied through the fourth transistor NM4 into a first output buffer $35_1$ of the output buffer 35.

The encryption code data and the information data stored in the rest of the encryption code data arrays $31A_2$–$3A_m$ and memory arrays $31B_2$–$31B_m$ is encrypted through each of the read data encryption processors $33_2$–$33_m$ through bit lines $B/L_2$–$B/L_m$. The outputs are provided to the rest of the output buffers 35B–35M of the output buffer 35, whereby the output buffer 35 outputs the encrypted M-bit data $D_1$–$D_m$.

At this time, any "0" output from the bit line output data $D_1$–$D_m$ of the output buffers $35_1$–$35_m$ causes the NAND gate ND1 to generate a high level signal, so that a first encryption word line $EW/L_1$ selected by the present encryption word line operator 32A is driven continuously, whereby the first encryption cell $EC_{1,A1}$ is enabled in the next step to output the data stored therein as described above.

When a part of the memory cells is not used or when no data is stored in a certain region, each of the M-bit output data $D_1$–$D_m$ remains at the value of "1". Accordingly, the output detecting signal DET from the NAND gate ND1 turns to a low level, whereby the count value of the encryption word line operator 32A is incremented by one and then the next encryption word line, e.g., the second encryption word line $EW/L_2$, is selected. As a result, the second encryption cell $EC_2$ is enabled to thereby output the stored encryption code data.

Accordingly, when the word line $W/L_1$ is enabled to cause the memory cell $MC_{1,B1}$ to output a 1-bit cell data which is logically combined with the encryption code data from the second encryption cell $EC_{2,A1}$. The combined value is supplied to the first output buffer 35, of the output buffer 35.

In the same way as described above, a second cell of the rest of the encryption memory array $31A_2$–$31A_m$ is accessed, and an information data stored in a corresponding cell of the memory arrays $31B_2$–$31B_m$ are applied through each of the read data encrypting processors 33B–33M to provide encrypted data to the rest of the output buffers $35_1$–$35_m$ of the output buffer 35. The output buffer 35 outputs encrypted M-bit data $D_1$–$D_m$.

At this time, when each of the output data $D_1$–$D_m$ from the output buffers $35_1$–$35_m$ is "1", the output detecting signal DET from the NAND gate ND1 is set at a low level, whereby the count value of the encryption word line operator 32A is incremented by one. As a result, a third encryption word line $EW/L_3$ serving as the next encryption word line is selected to operate.

As described above, when the value of each of the output data D1–Dm is "1", the encryption word operator 32A increases the internal count value of the counter, and the next encryption word line $EW/L_x$ is enabled. Accordingly, the encryption data cell, e.g., $EC_{1,A1}$ and $EC_{k,A1}$ of the encryption memory arrays $31A_1$–$31A_m$ is sequentially selected, and the encryption code data stored in the corresponding cell is outputted and the information data of the memory array $31B_1$–$31B_m$ is encrypted. When the k-bit counter finishes counting from "0" to (k+1), where k is the number of encryption word lines, the counting is stopped, and the counter is reset to zero. When the next address signal $ADD_{WL}$ is applied, the carry value "1" is applied to the output buffer 35. From this time, each of the output data $D_1$–$D_m$ remains at the value "1".

As described above, the encryption code decoding prevention circuit for a semiconductor memory device, such as an EPROM, in accordance with the present invention prevents an encrypted data from being exposed by storing "1" in each of the untouched (unused) cells so as to prevent an unauthorized user from being able to judge whether or not the cells actually remain empty.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. An encryption code decoding prevention circuit for a semiconductor memory device, comprising:

a plurality of encryption code cells, each storing an encryption data on each bit line and outputting a corresponding encryption code data in accordance with selectively enabled multiple encryption word lines;

an encryption word line operator for enabling a corresponding encryption word line by incrementing an internal count value by one each time an output detecting signal turns to a first prescribed level, stopping further counting when all ready-set values are counted, and continuously outputting a carry value to an output buffer;

a word line operator for operating a corresponding word line selected from a plurality of word lines in accordance with an input address signal;

a plurality of read data encrypting processors for encrypting data output from memory cells by using the encryption code data output from the encryption code data cells;

an output data detector for enabling the output detecting signal when all bit lines are judged not to have data thereon, by checking an n-bit output applied from the read data encrypting processors to the output buffer; and the output buffer for amplifying the n-bit data output from the read data encrypting processors and outputting an output data of "1" each time the carry value is applied thereto from the encryption word line operator.

2. The circuit of claim 1, wherein the output data detector includes a NAND gate.

3. A memory device, comprising:

a plurality of encryption memory arrays, each having a plurality of encryption cells for storing encryption code data;

a plurality of memory arrays, each having a plurality of memory cells for storing information data;

a first word line operator that selects one of a plurality of word lines, each word line coupled to a corresponding memory cell of each memory array;

an encryption word line operator that selects one of a plurality of encryption word lines, each coupled to a corresponding encryption cell of each encryption memory array;

a bit line operator that selects one of a plurality of bit lines, each coupled to correspond one of said plurality of memory arrays and encryption memory arrays;

a plurality of encrypting processors, each encrypting the information data with the encryption code data provide on a corresponding bit line;

a detector coupled to each encrypting processor to detect a prescribed condition and coupled to said encryption word line operator; and an output buffer coupled to each encrypting processor.

4. The memory device of claim 3, wherein said encryption word line operator is responsive to an output signal of said detector to one of maintaining a selecting of one of said plurality of encryption word lines and sequentially selecting each of said plurality of encryption word lines.

5. The memory device of claim 4, wherein said encryption word line operator increments an internal counter to sequentially select another encryption word line when each of encrypted data output from said plurality of encryption processors has a first prescribed value.

6. The memory device of claim 5, wherein the first prescribed value is a binary value of one.

7. The memory device of claim 4, wherein said encryption word line operator maintains a selection of a encryption word line when any of encrypted data output from said plurality of encryption processors have a second prescribed value.

8. The memory device of claim 7, wherein the second prescribed value is a binary value of zero.

9. The memory device of claim 3, wherein said encryption word line operator generates a prescribed carry value to said data buffer when all of said plurality of encryption word lines have been sequentially selected.

10. The memory device of claim 9, wherein the prescribed carry value is a binary value of one.

11. The memory device of claim 3, wherein said data buffer comprises a plurality of buffers, each coupled to a corresponding encryption processor.

12. The memory device of claim 3, wherein said detector is a NAND gate having inputs coupled to said plurality of encryption processors.

* * * * *